US010887711B2

(12) United States Patent
Chuang

(10) Patent No.: US 10,887,711 B2
(45) Date of Patent: Jan. 5, 2021

(54) SOUND RECORDING CIRCUIT

(71) Applicant: REALTEK SEMICONDUCTOR CORPORATION, Hsinchu (TW)

(72) Inventor: Tsung-Peng Chuang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/552,306

(22) Filed: Aug. 27, 2019

(65) Prior Publication Data

US 2020/0077213 A1 Mar. 5, 2020

(30) Foreign Application Priority Data

Aug. 28, 2018 (TW) .............................. 107129936 A

(51) Int. Cl.
| H04R 29/00 | (2006.01) |
| H04R 1/32 | (2006.01) |
| H03M 1/12 | (2006.01) |
| H03M 1/18 | (2006.01) |
| H04R 3/00 | (2006.01) |

(52) U.S. Cl.
CPC ........... *H04R 29/004* (2013.01); *H04R 1/326* (2013.01); *H03M 1/12* (2013.01)

(58) Field of Classification Search
None
See application file for complete search history.

(56) References Cited

U.S. PATENT DOCUMENTS

| 8,600,079 | B2* | 12/2013 | Kimura ................ H04B 15/005 |
| | | | 381/111 |
| 9,236,837 | B2 | 1/2016 | Kropfitsch et al. | |
| 9,831,844 | B2 | 11/2017 | Yurrtas et al. | |
| 2011/0142261 | A1* | 6/2011 | Josefsson ................ H04R 3/00 |
| | | | 381/107 |
| 2013/0051582 | A1* | 2/2013 | Kropfitsch ................ H03F 1/56 |
| | | | 381/111 |
| 2013/0266156 | A1* | 10/2013 | Frohlich ................... H03F 1/34 |
| | | | 381/120 |

(Continued)

FOREIGN PATENT DOCUMENTS

CN 102957388 A 3/2013

*Primary Examiner* — Qin Zhu
(74) *Attorney, Agent, or Firm* — WPAT, PC

(57) ABSTRACT

Disclosed is a sound recording circuit capable of adjusting microphone sensitivity and preventing sound cracks caused by overly loud sound. The sound recording circuit includes: a microphone bias circuit configured to provide a bias voltage for a microphone circuit; an AC coupling capacitor configured to output an analog input signal according to a microphone signal of the microphone circuit; an analog amplifier circuit configured to output an analog output signal according to the analog input signal; an analog-to-digital converter configured to output a digital input signal according to the analog output signal; a digital amplifier circuit configured to output a digital output signal according to the digital input signal; and a signal detector configured to control an analog gain of the analog amplifier circuit, a digital gain of the digital amplifier circuit, and the bias voltage of the microphone bias circuit.

16 Claims, 8 Drawing Sheets

(56) References Cited

U.S. PATENT DOCUMENTS

| | | | |
|---|---|---|---|
| 2014/0254809 A1* | 9/2014 | Fan | H04R 3/007 |
| | | | 381/58 |
| 2014/0307910 A1* | 10/2014 | Howlett | H04R 3/00 |
| | | | 381/369 |
| 2016/0087596 A1* | 3/2016 | Yurrtas | H04R 1/04 |
| | | | 381/111 |
| 2016/0157017 A1* | 6/2016 | Lesso | G01D 5/24476 |
| | | | 381/71.7 |
| 2016/0173994 A1* | 6/2016 | Nicollini | H04R 19/04 |
| | | | 381/113 |

* cited by examiner

SOUND RECORDING CIRCUIT

BACKGROUND OF THE INVENTION

1. Field of the Invention

The present invention relates a sound recording circuit, especially to a sound recording circuit capable of preventing sound cracks caused by loud sound.

2. Description of Related Art

An anti-clamping recording function is widely used for a sound recording device such as a cellphone, a camera, a video/audio recorder, a pen recorder, and a webcam. The function is mainly for preventing the audio signals that are recorded to have sound cracks or clamping components, thereby reducing the distortions in the recording of sounds. The cause of sound cracks/clamping components in the recording often relates to the design and/or the misuse of a sound recording device.

A general sound recording device having the function of dynamical adjustment in microphone sensitivity and the function of anti-clamping recording will usually include an analog amplifier, an analog-to-digital converter (ADC), a digital amplifier, and a signal detector. The analog amplifier amplifies a microphone alternating-current (AC) signal to generate an analog amplified signal. The ADC generates a digital signal according to the analog amplified signal. The digital amplifier generates a digital amplified signal according to the digital signal and outputs the digital amplified signal to a storage device for storage. The signal detector detects the output of the ADC to adjust the gain of the analog amplifier and/or the gain of the digital amplifier and thereby prevents the problem caused by audio clamping signal. However, although the above-mentioned sound recording device can deal with the clamping phenomenon of the analog amplified signal (that is caused by the mismatch between the microphone sensitivity and the gain of the analog amplifier) and the clamping phenomenon of the digital amplified signal (that is caused by the mismatch between the microphone sensitivity and the gain of the digital amplifier) by the adjustment in the gains of the analog amplifier and the digital amplifier, the sound recording device is helpless when the microphone AC signal itself is a clamping signal; this circumstance is caused by the mismatch between the characteristic of a microphone and a microphone bias circuit of the sound recording device or caused by loud sound received by the microphone. Due to the lack of techniques for dealing with the microphone bias circuit, when the microphone AC signal itself is an audio signal that has been clamped, the recording of sound will unavoidably include distortion regardless of the adjustment in the gain of the analog amplifier and/or the gain of the digital amplifier. In addition, the current techniques for adjusting microphone sensitivity in different recording modes or scenarios are still lacking.

SUMMARY OF THE INVENTION

An object of the present invention is to provide a circuit being an improvement over the prior art.

An embodiment of the circuit of the present invention is capable of being coupled to a microphone circuit and a storage circuit, and includes a microphone bias circuit, an alternating-current (AC) coupling capacitor, an analog amplifier circuit, an analog-to-digital converter (ADC), a digital amplifier circuit, and a signal detector. The microphone bias circuit is configured to provide a bias voltage for the microphone circuit so as to allow the microphone circuit to generate a microphone signal according to the bias voltage. The AC coupling capacitor is configured to output an analog input signal according to the microphone signal. The analog amplifier circuit is configured to output an analog output signal according to the analog input signal. The analog-to-digital converter is configured to output a digital input signal according to the analog output signal. The digital amplifier circuit is configured to generate a digital output signal according to the digital input signal and output the digital output signal to the storage circuit. The signal detector is configured to control an analog gain of the analog amplifier circuit and a digital gain of the digital amplifier circuit according to the digital input signal, and also configured to control the bias voltage of the microphone bias circuit according to the digital input signal. With the signal detector controlling the bias voltage of the microphone bias circuit, the sound recording circuit of this embodiment is capable of solving the problem of sound cracks caused by a microphone signal (i.e., clamping signal here) exceeding the nominal maximum output limit of the microphone circuit, and/or capable of executing the function of dynamical adjustment in microphone sensitively.

Another embodiment of the circuit of the present invention is capable of being coupled to a microphone circuit and a storage circuit, and includes a microphone bias circuit, an AC coupling capacitor, an analog amplifier circuit, a first ADC, a digital amplifier circuit, a first signal detector, a second ADC, and a second signal detector. The microphone bias circuit is configured to provide a bias voltage for the microphone circuit so as to allow the microphone circuit to generate a microphone signal according to the bias voltage. The AC coupling capacitor is configured to output an analog input signal according to the microphone signal. The analog amplifier circuit is configured to output an analog output signal according to the analog input signal. The first ADC is configured to output a first digital input signal according to the analog output signal. The digital amplifier circuit is configured to generate a digital output signal according to the first digital input signal and output the digital output signal to the storage circuit. The first signal detector is configured to control an analog gain of the analog amplifier circuit and a digital gain of the digital amplifier circuit according to the first digital input signal. The second ADC is configured to generate a second digital input signal according to the analog input signal. The second signal detector is configured to control the bias voltage of the microphone bias circuit according to the second digital input signal. With the second ADC and the second signal detector controlling the bias voltage of the microphone bias circuit, the sound recording circuit of this embodiment is capable of dealing with a microphone signal (i.e., clamping signal here) exceeding the nominal maximum output limit of the microphone circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a sound recording circuit capable of controlling the bias voltage for a microphone circuit to prevent the problem of sound cracks and/or capable of dynamically adjusting the sensitivity of the microphone circuit.

Figure 1:
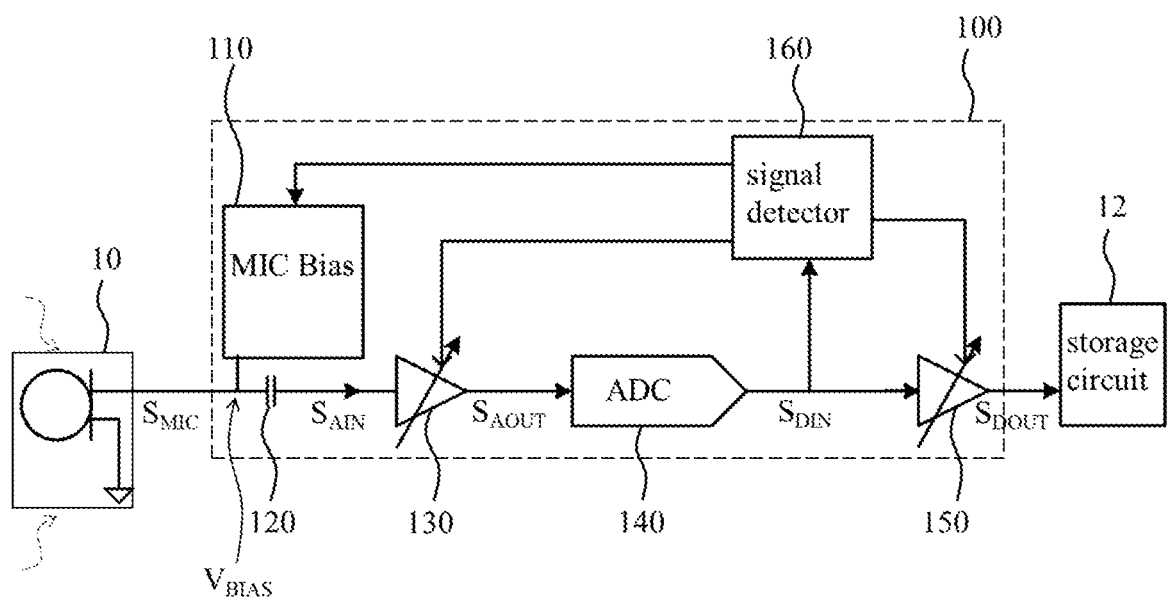
FIG. 1 shows an embodiment of the sound recording circuit of the present invention.

FIG. 1 shows an embodiment of the sound recording circuit of the present invention. The sound recording circuit 100 of FIG. 1 includes a microphone bias circuit 110 (MIC Bias), an alternating-current (AC) coupling capacitor 120, an analog amplifier circuit 130, an analog-to-digital converter (ADC) 140, a digital amplifier circuit 150, and a signal detector 160.

Figure 2:
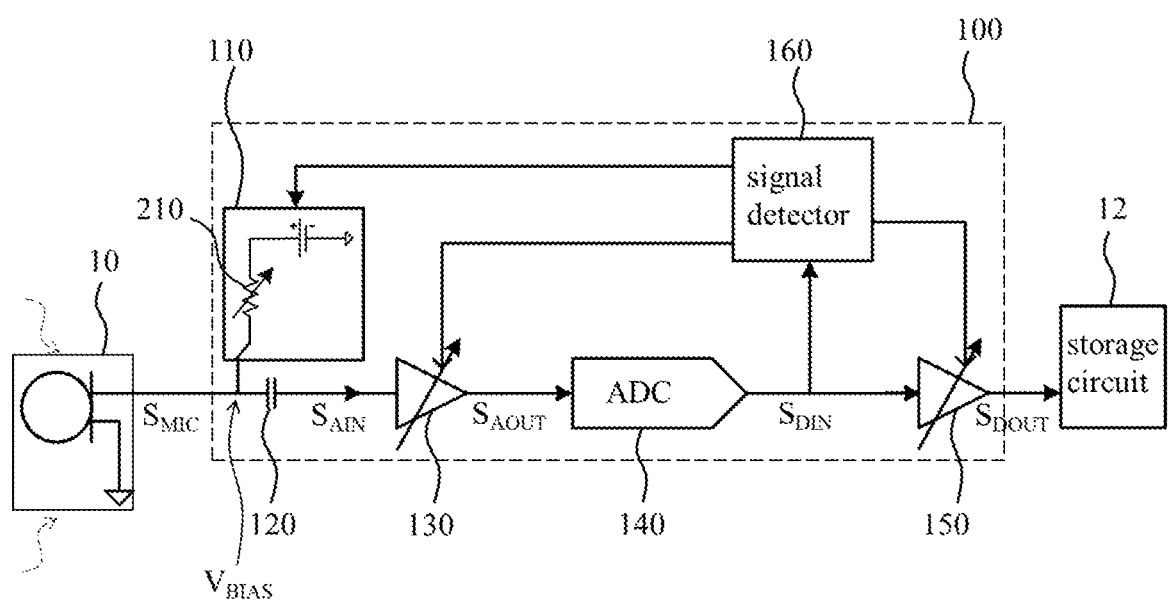
FIG. 2 shows an embodiment of the microphone bias circuit of FIG. 1.
Figure 3:
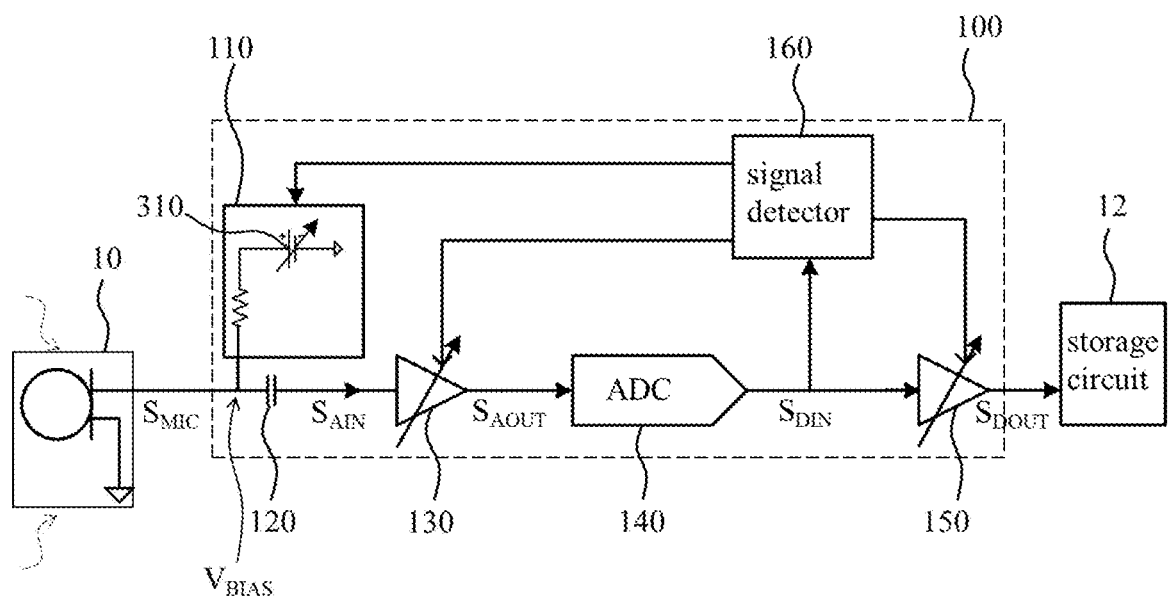
FIG. 3 shows another embodiment of the microphone bias circuit of FIG. 1.
Figure 4:
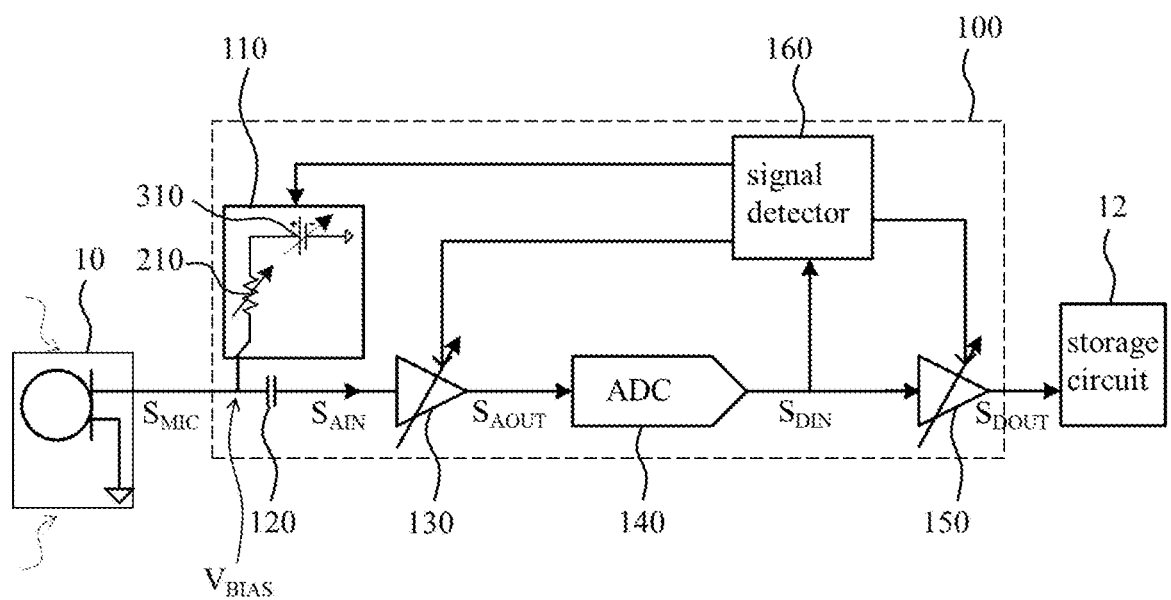
FIG. 4 shows yet another embodiment of the microphone bias circuit of FIG. 1.

Please refer to FIG. 1. The microphone bias circuit 110 is configured to provide a bias voltage $V_{BIAS}$ for a microphone circuit 10 so as to allow the microphone circuit 10 to reflect sound waves (as shown by the dashed-line arrows of FIG. 1) according to the bias voltage $V_{BIAS}$ and thereby generate a microphone signal $S_{MIC}$. The microphone bias circuit 110 includes an adjustable resistor (e.g., the adjustable resistor 210 of FIG. 2), an adjustable voltage source (e.g., the adjustable voltage source 310 of FIG. 3), or both of the adjustable resistor and the adjustable voltage source (e.g., the adjustable resistor 210 and the adjustable voltage source 310 of FIG. 4) while the sound recording circuit 100 can optionally include the microphone circuit 10 that is a known or self-developed circuit. The AC coupling capacitor 120 is configured to output an analog input signal $S_{AIN}$ according to the microphone signal $S_{MIC}$. The analog amplifier circuit 130 is configured to output an analog output signal $S_{AOUT}$ according to the analog input signal $S_{AIN}$ and the analog gain $G_A$ of the analog amplifier circuit 130; the analog amplifier circuit 130 can be a known or self-developed circuit. The ADC 140 is configured to output a digital input signal $S_{DIN}$ according to the analog output signal $S_{AOUT}$; the ADC 140 can be a known or self-developed circuit. The digital amplifier circuit 150 is configured to generate a digital output signal $S_{DOUT}$ according to the digital input signal $S_{DIN}$ and the digital gain $G_D$ of the digital amplifier circuit 150, and then output the digital output signal $S_{DOUT}$ to a storage circuit 12; each of the digital amplifier circuit 150 and the storage circuit 12 can be a known or self-developed circuit, and the storage circuit 12 is included in or independent of the sound recording circuit 100. The signal detector 160 is configured to control the analog gain $G_A$ of the analog amplifier circuit 130 and the digital gain $G_D$ of the digital amplifier circuit 150 according to the digital input signal $S_{DIN}$, and also configured to control the bias voltage $V_{BIAS}$ of the microphone bias circuit 110 according to the digital input signal $S_{DIN}$. With the signal detector 160 controlling the bias voltage $V_{BIAS}$ of the microphone bias circuit 110, the sound recording circuit 100 of this embodiment is capable of relieving the sound distortion (e.g., sound cracks) caused by a microphone signal (i.e., clamping signal here) exceeding the nominal maximum output limit of the microphone circuit 10, and/or capable of adaptively adjusting the sensitivity of the microphone circuit 10 for different sound recording settings.

Figure 5:
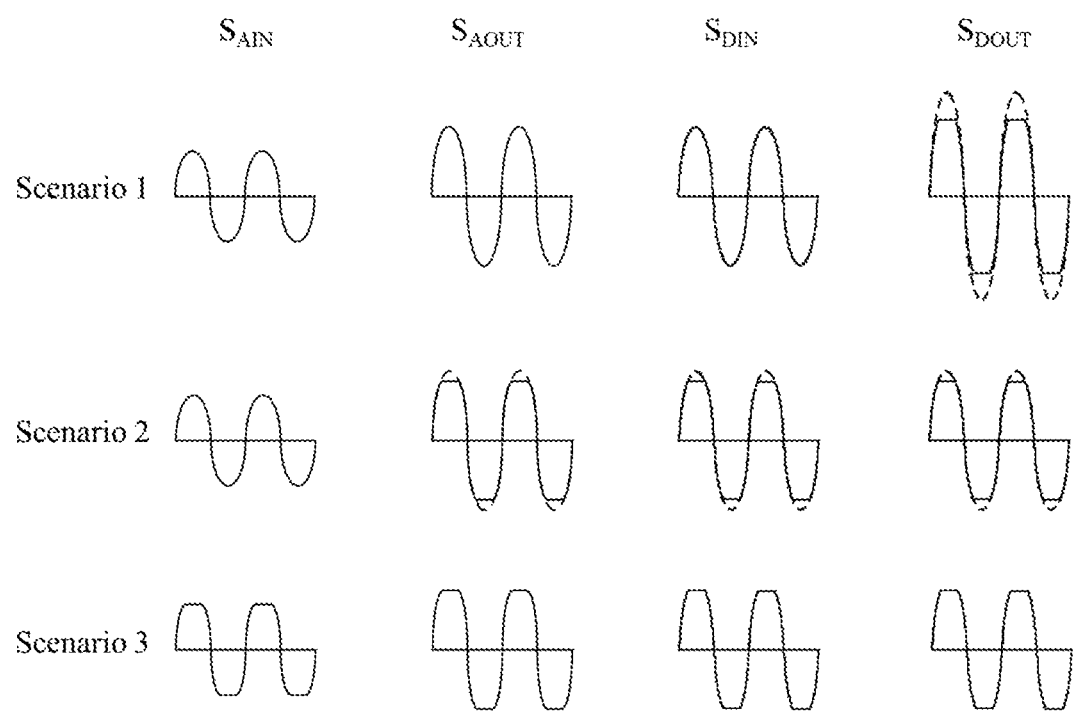
FIG. 5 shows several scenarios of the sound recording circuit of FIG. 1 generating clamping signals.

FIG. 5 shows several scenarios of the sound recording circuit 100 generating clamping signals. These scenarios include:

(1) Scenario 1: The mismatch between the sensitivity of the microphone circuit 10 and the gains of the analog amplifier circuit 130 and the digital amplifier circuit 150 leads to the digital output signal $D_{DOUT}$ being a clamping signal.

(2) Scenario 2: The mismatch between the sensitivity of the microphone circuit 10 and the gain of the analog amplifier circuit 130 leads to the analog output signal $S_{AOUT}$ and the derivative signals thereof being clamping signals.

(3) Scenario 3: The mismatch between the microphone circuit 10 and the microphone bias circuit 110 or overly loud sound leads to the analog input signal $S_{AIN}$ and the derivative signals thereof being clamping signals.

When the signal detector 160 detects Scenario 1, the signal detector 160 adjusts at least one of the analog gain $G_A$ and the digital gain $G_D$ so as to prevent the digital output signal $S_{DOUT}$ from being a clamping signal. When the signal detector 160 detects Scenario 2, the signal detector 160 adjusts the analog gain $G_A$ and optionally adjusts the digital gain $G_D$ so as to prevent the analog output signal $S_{AOUT}$ and the derivative signals thereof from being clamping signals. When the signal detector 160 detects Scenario 3, which means that the signal detector 160 finds that the analog input signal $S_{AIN}$ is a clamping signal, the signal detector 160 adjusts the bias voltage $V_{BIAS}$ of the microphone bias circuit 110 and optionally adjusts at least one of the analog gain $G_A$ and the digital gain $G_D$ so as to prevent the analog input signal $S_{AIN}$ and the derivative signals thereof from being clamping signals.

In an exemplary implementation, when the signal detector 160 detects Scenario 3, the signal detector 160 determines whether the analog input signal $S_{AIN}$ is a clamping signal in accordance with a pattern of the digital input signal $S_{DIN}$ (e.g., successive binary bits such as "1 1 1 1 . . . " while the number of these bits can be determined according to the demand for implementation), the analog gain $G_A$ of the analog amplifier circuit 130, and the nominal maximum output limit $TH_{MIC}$ of the microphone circuit 10, and accordingly determines whether the bias voltage $V_{BIAS}$ of the microphone bias circuit 110 needs to be adjusted. More specifically, the signal detector 160 may carry out the following steps to determine whether the analog input signal $S_{AIN}$ is a clamping signal: obtaining the signal strength of the digital input signal $S_{DIN}$ or the signal strength of the analog output signal $S_{AOUT}$ (e.g., 1.2 Vrms (root-mean-square voltage)) according to the pattern of the digital input signal $S_{DIN}$; dividing the signal strength of the digital input signal $S_{DIN}$ or the signal strength of the analog output signal $S_{AOUT}$ by the analog gain $G_A$ (e.g., 20 dB=10 times) or offsetting the effect of the analog amplifier circuit 130 to obtain the signal strength of the analog input signal $S_{AIN}$ (e.g., 1.2 Vrms/10=0.12 Vrms); then comparing the signal strength of the analog input signal $S_{AIN}$ with the nominal maximum output limit $TH_{MIC}$ of the microphone circuit 10 (e.g., 0.1 Vrms) to determine that the analog input signal $S_{AIN}$ is a clamping signal if the signal strength of the analog input signal $S_{AIN}$ is higher than the nominal maximum output limit $TH_{MIC}$ (e.g., 0.12 Vrms>0.1 Vrms).

Figure 6:
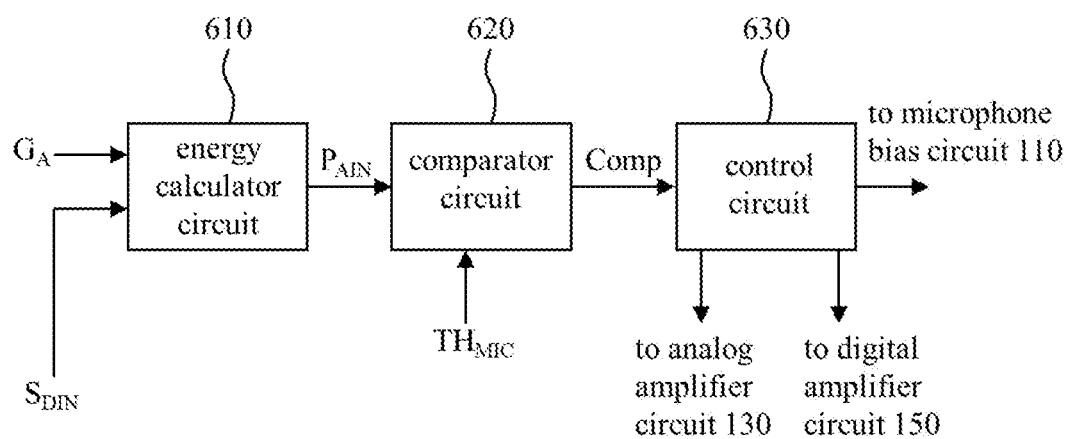
FIG. 6 shows an embodiment of the signal detector of FIG. 1.

FIG. 6 shows an embodiment of the signal detector 160. The signal detector 160 of FIG. 6 includes an energy calculator circuit 610, a comparator circuit 620, and a control circuit 630. The energy calculator circuit 610 is configured to calculate and output an energy value $P_{AIN}$ of the analog input signal $S_{AIN}$ according to the digital input signal $S_{DIN}$ and the analog gain $G_A$ of the analog amplifier circuit 130; for instance, the energy calculator circuit 610 executes a look-up table operation or predetermined calculation according to the pattern of the digital input signal $S_{DIN}$ to obtain the signal strength of the digital input signal $S_{DIN}$ or the signal strength of the analog output signal $S_{AOUT}$, and then the energy calculator circuit 610 divides the signal strength of the digital input signal $S_{DIN}$ or the signal strength of the analog output signal $S_{AOUT}$ by the analog gain $G_A$ or offsets the effect of the analog amplifier circuit 130 to obtain the energy value $P_{AIN}$ of the analog input signal $S_{AIN}$. The comparator circuit 620 is configured to compare the energy value $P_{AIN}$ with the nominal maximum output limit $TH_{MIC}$ of the microphone circuit 10 and thereby output a comparison value Comp; for instance, the comparator circuit 620 compares the energy value $P_{AIN}$ of the analog input signal $S_{AIN}$ with the nominal maximum output limit $TH_{MIC}$ of the microphone circuit 10 and thereby determines that the analog input signal $S_{AIN}$ is a clamping signal if the energy value $P_{AIN}$ of the analog input signal $S_{AIN}$ is higher than the nominal maximum output limit $TH_{MIC}$ of the microphone circuit 10. The control circuit 630 is configured to adjust the bias voltage $V_{BIAS}$ of the microphone bias circuit 110 and optionally adjust at least one of the analog gain $G_A$ and the digital gain $G_D$ in response to the comparison value Comp indicating that the energy value $P_{AIN}$ is higher than the nominal maximum output limit $TH_{MIC}$.

Figure 7:
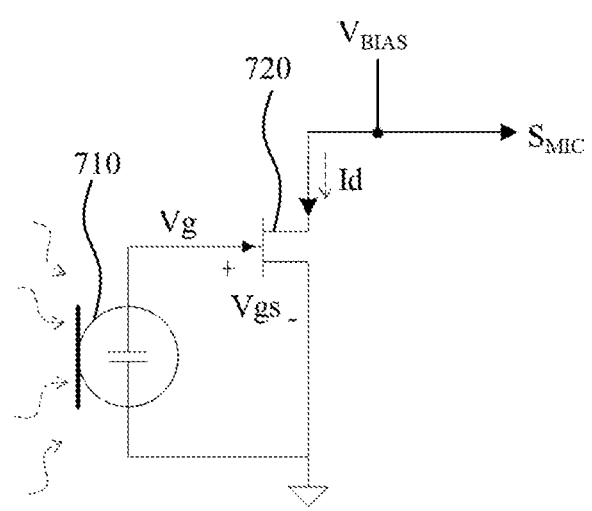
FIG. 7 shows an equivalent circuit of the microphone circuit of FIG. 1.

FIG. 7 shows an exemplary microphone circuit equivalent to the microphone circuit 10. The microphone circuit 700 of FIG. 7 is an electret condenser microphone (ECM) including an electret component 710 and a common-source junction field effect transistor (JFET) 720. The electret component 710 is capable of outputting different gate voltages Vg to the gate of the JFET 720 in response to the variation of sound waves (as shown by the dashed-line arrows of FIG. 5), and thus the output (i.e., the microphone signal $S_{MIC}$) of the drain of the JFET 720 will vary with the change of the gate-to-source voltage Vgs of the JFET 720, in which the source voltage of the JFET 720 in FIG. 7 is a ground voltage or a low supply voltage. In addition, since the conversion relation between the signal output (i.e., the microphone signal $S_{MIC}$) of the drain of the JFET 720 and the signal input (i.e., the voltage Vg) of the JFET 720 will vary with the DC bias voltage (which is affected by the current Id determined by the bias voltage $V_{BIAS}$), the output of the JFET 720 (i.e., $S_{MIC}$) can be adjusted with the proper control over the bias voltage $V_{BIAS}$ and the distortion of the output of the JFET 720 can be relieved.

Figure 8:
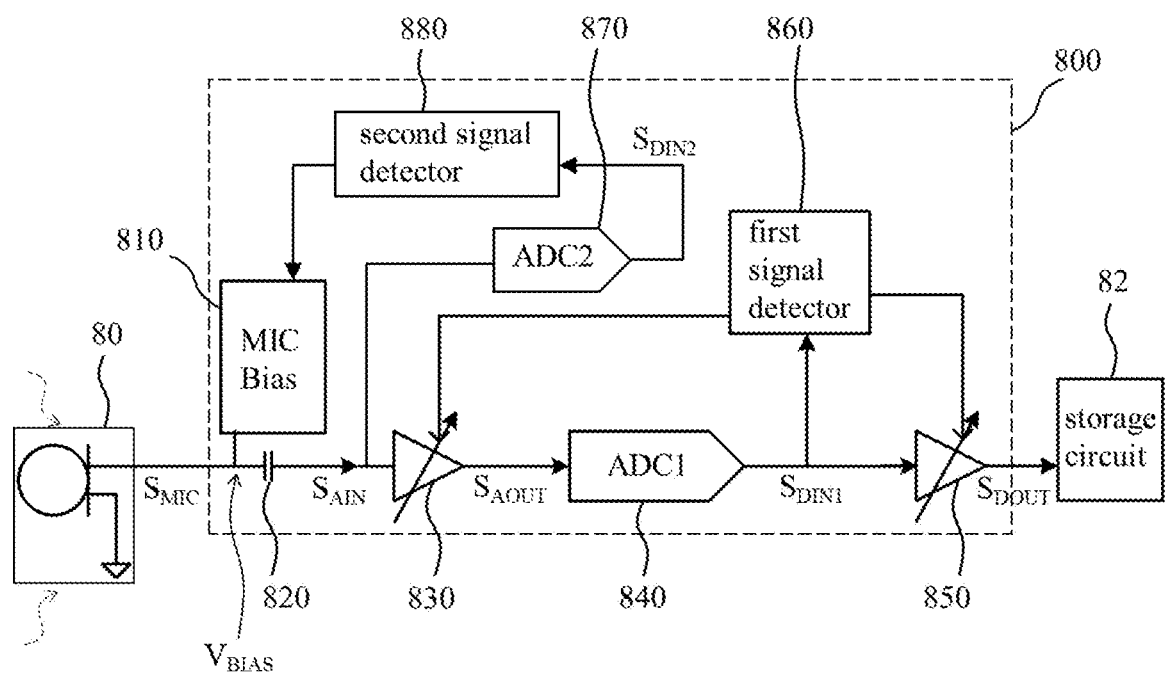
FIG. 8 shows another embodiment of the sound recording circuit of the present invention.

FIG. 8 shows another embodiment of the sound recording circuit of the present invention. The sound recording circuit 800 of FIG. 8 includes a microphone bias circuit (MIC Bias), an AC coupling capacitor 820, an analog amplifier circuit 830, a first ADC 840 (ADC1), a digital amplifier circuit 850, a first signal detector 860, a second ADC 870 (ADC2), and a second signal detector 880. The microphone bias circuit 820 is configured to provide a bias voltage $V_{BIAS}$ for a microphone circuit 80 (which is included in or independent of the sound recording circuit 800) so as to allow the microphone circuit 80 to generate a microphone signal $S_{MIC}$ according to the bias voltage $V_{BIAS}$. The AC coupling capacitor 820 is configured to output an analog input signal $S_{AIN}$ according to the microphone signal $S_{MIC}$. The analog amplifier circuit 830 is configured to output an analog output signal $S_{AOUT}$ according to the analog input signal $S_{AIN}$. The first ADC 840 is configured to output a first digital input signal $S_{DIN1}$ according to the analog output signal $S_{AOUT}$. The digital amplifier circuit 850 is configured to generate a digital output signal $S_{DOUT}$ according to the first digital input signal $S_{DIN1}$ and output the digital output signal $S_{DOUT}$ to a storage circuit 82 (which is included in or independent of the sound recording circuit 800). The first signal detector 860 is configured to control an analog gain of the analog amplifier circuit 830 and a digital gain of the digital amplifier circuit 850 according to the first digital input signal $S_{DIN1}$. The second ADC 870 is configured to generate a second digital input signal $S_{DIN2}$ according to the analog input signal $S_{AIN}$. The second signal detector 880 is configured to control the bias voltage $V_{BIAS}$ of the microphone bias circuit 810 according to the second digital input signal $S_{DIN2}$. In this embodiment, the second ADC 870 generates the second digital input signal $S_{DIN2}$ according to the analog input signal $S_{AIN}$ instead of the first digital output signal $S_{DIN1}$/the analog output signal $S_{AOUT}$ so that the second signal detector 880 can execute detection according to the second digital input signal $S_{DIN2}$ early in comparison with the signal detector 160 of FIG. 1 and control the bias voltage $V_{BIAS}$ of the microphone bias circuit 810 promptly; in brief, the prompt detection of this embodiment can shorten the duration of the recording (i.e., the recording data stored in the storage circuit 82) including sound distortion.

In an exemplary implementation, the second signal detector 880 determines whether the analog input signal $S_{AIN}$ is a clamping signal according to a pattern of the second digital input signal $S_{DIN2}$ (e.g., successive binary bits, each of which is bit "1" while the number of these bits can be determined according to the demand for implementation) and the nominal maximum output limit of the microphone circuit 80. More specifically, the second signal detector 880 may carry out the following steps to determine whether the analog input signal $S_{AIN}$ is a clamping signal: obtaining the signal strength of the analog input signal $S_{AIN}$ according to the pattern of the second digital input signal $S_{DIN2}$; and then comparing the signal strength of the analog input signal $S_{AIN}$ with the nominal maximum output limit of the microphone circuit 80 to determine that the analog input signal $S_{AIN}$ is a clamping signal if the signal strength of the analog input signal $S_{AIN}$ is higher than the nominal maximum output limit. In addition, an embodiment of the second signal detector 880 is similar to the signal detector 160 of FIG. 6 and includes: an energy calculator circuit configured to calculate and output an energy value of the analog input signal $S_{AIN}$ according to the second digital input signal $S_{DIN2}$; a comparator circuit configured to compare the energy value with the nominal maximum output limit of the microphone circuit 80 and thereby output a comparison value; and a control circuit configured to adjust the bias voltage $V_{BIAS}$ of the microphone bias circuit 810 in response to the comparison value indicating that the energy value is higher than the nominal maximum output limit of the microphone circuit 80.

Since those of ordinary skill in the art can appreciate the detail and the modification of the embodiment of FIG. 8 by referring to the disclosure of the embodiments of FIGS. 1~7, which implies that the features of the embodiments of FIGS.

1-7 can be applied to the embodiment of FIG. 8 in a reasonable way, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the sound recording circuit of the present invention can control the bias voltage for a microphone circuit and thereby reduce clamping signals caused by circuit mismatch or overly loud sound; accordingly, the problem of sound distortion such as sound cracks can be relieved.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit capable of being coupled to a microphone circuit and a storage circuit, comprising:
    a microphone bias circuit configured to provide a bias voltage for the microphone circuit;
    an alternating-current (AC) coupling capacitor configured to output an analog input signal according to a microphone signal of the microphone circuit;
    an analog amplifier circuit configured to output an analog output signal according to the analog input signal;
    an analog-to-digital converter configured to output a digital input signal according to the analog output signal;
    a digital amplifier circuit configured to generate a digital output signal according to the digital input signal and output the digital output signal to the storage circuit; and
    a signal detector configured to control an analog gain of the analog amplifier circuit, a digital gain of the digital amplifier circuit, and the bias voltage of the microphone bias circuit according to the digital input signal,
    wherein the signal detector adjusts the bias voltage of the microphone bias circuit when the signal detector determines that the analog input signal is a clamping signal; the signal detector determines whether the analog input signal is the clamping signal according to a pattern of the digital input signal, the analog gain of the analog amplifier circuit, and a nominal maximum output limit of the microphone circuit; and the pattern of the digital input signal is successive identical binary bits.

2. The circuit of claim 1, wherein the signal detector controls at least one of a voltage, a resistor, and a current of the microphone bias circuit so as to control the bias voltage of the microphone bias circuit.

3. The circuit of claim 1, wherein the signal detector includes:
    an energy calculator circuit configured to calculate and output an energy value of the analog input signal according to the digital input signal and the analog gain of the analog amplifier circuit;
    a comparator circuit configured to compare the energy value with a nominal maximum output limit of the microphone circuit and thereby output a comparison value; and
    a control circuit configured to adjust the bias voltage of the microphone bias circuit in response to the comparison value indicating that the energy value is higher than the nominal maximum output limit of the microphone circuit.

4. The circuit of claim 1, wherein the microphone bias circuit is dynamically adjusted to control sensitivity of the microphone circuit.

5. A circuit capable of being coupled to a microphone circuit and a storage circuit, comprising:
    a microphone bias circuit configured to provide a bias voltage for the microphone circuit;
    an AC coupling capacitor configured to output an analog input signal according to a microphone signal of the microphone circuit;
    an analog amplifier circuit configured to output an analog output signal according to the analog input signal;
    a first analog-to-digital converter configured to output a first digital input signal according to the analog output signal;
    a digital amplifier circuit configured to generate a digital output signal according to the first digital input signal and output the digital output signal to the storage circuit;
    a first signal detector configured to control an analog gain of the analog amplifier circuit and a digital gain of the digital amplifier circuit according to the first digital input signal;
    a second analog-to-digital converter configured to generate a second digital input signal according to the analog input signal; and
    a second signal detector configured to control the bias voltage of the microphone bias circuit according to the second digital input signal.

6. The circuit of claim 5, wherein when the second signal detector determines that the analog input signal is a clamping signal, the second signal detector adjusts the bias voltage of the microphone bias circuit.

7. The circuit of claim 6, wherein the second signal detector determines whether the analog input signal is the clamping signal according to a pattern of the second digital input signal and a nominal maximum output limit of the microphone limit.

8. The circuit of claim 5, wherein the second signal detector controls at least one of a voltage, a resistor, and a current of the microphone bias circuit so as to control the bias voltage of the microphone bias circuit.

9. The circuit of claim 5, wherein the second signal detector includes:
    an energy calculator circuit configured to calculate and output an energy value of the analog input signal according to the second digital input signal;
    a comparator circuit configured to compare the energy value with a nominal maximum output limit of the microphone circuit and thereby output a comparison value; and
    a control circuit configured to adjust the bias voltage of the microphone bias circuit in response to the comparison value indicating that the energy value is higher than the nominal maximum output limit of the microphone circuit.

10. A circuit capable of being coupled to a microphone circuit and a storage circuit, comprising:
    a microphone bias circuit configured to provide a bias voltage for the microphone circuit;

an alternating-current (AC) coupling capacitor configured to output an analog input signal according to a microphone signal of the microphone circuit;

an analog amplifier circuit configured to output an analog output signal according to the analog input signal;

an analog-to-digital converter configured to output a digital input signal according to the analog output signal;

a digital amplifier circuit configured to generate a digital output signal according to the digital input signal and output the digital output signal to the storage circuit; and a signal detector configured to control an analog gain of the analog amplifier circuit, a digital gain of the digital amplifier circuit, and the bias voltage of the microphone bias circuit according to the digital input signal, wherein the signal detector includes:

an energy calculator circuit configured to divide signal strength of the digital input signal by the analog gain of the analog amplifier circuit to obtain an energy value of the analog input signal;

a comparator circuit configured to compare the energy value with a nominal maximum output limit of the microphone circuit and thereby output a comparison value; and a control circuit configured to adjust the bias voltage of the microphone bias circuit in response to the comparison value indicating that the energy value is higher than the nominal maximum output limit of the microphone circuit.

11. The circuit of claim 10, wherein when the signal detector determines that the analog input signal is a clamping signal, the signal detector adjusts the bias voltage of the microphone bias circuit.

12. The circuit of claim 11, wherein the signal detector determines whether the analog input signal is the clamping signal according to a pattern of the digital input signal, the analog gain of the analog amplifier circuit, and a nominal maximum output limit of the microphone circuit.

13. The circuit of claim 12, wherein the pattern of the digital input signal includes successive identical binary bits.

14. The circuit of claim 12, wherein the energy calculator circuit executes a look-up table operation or a predetermined algorithm according to the pattern of the digital input signal to obtain the signal strength.

15. The circuit of claim 10, wherein the signal detector controls at least one of a voltage, a resistor, and a current of the microphone bias circuit so as to control the bias voltage of the microphone bias circuit.

16. The circuit of claim 10, wherein the microphone bias circuit is dynamically adjusted to control sensitivity of the microphone circuit.

* * * * *